(12) United States Patent
Lee et al.

(10) Patent No.: US 9,230,933 B2
(45) Date of Patent: Jan. 5, 2016

(54) SEMICONDUCTOR DEVICE AND METHOD OF FORMING CONDUCTIVE PROTRUSION OVER CONDUCTIVE PILLARS OR BOND PADS AS FIXED OFFSET VERTICAL INTERCONNECT STRUCTURE

(75) Inventors: JaeHyun Lee, Kyunggi-Do (KR);
KyungHoon Lee, Kyunggi-Do (KR);
SeongWon Park, Kyoungki-do (KR);
KiYoun Jang, Kyoungki-do (KR)

(73) Assignee: STATS ChipPac, Ltd, Singapore (SG)

( * ) Notice: Subject to any disclaimer, the term of this patent is extended or adjusted under 35 U.S.C. 154(b) by 272 days.

(21) Appl. No.: 13/234,366

(22) Filed: Sep. 16, 2011

(65) Prior Publication Data
US 2013/0069221 A1   Mar. 21, 2013

(51) Int. Cl.
*H01L 21/44* (2006.01)
*H01L 23/00* (2006.01)
(Continued)

(52) U.S. Cl.
CPC .......... *H01L 24/13* (2013.01); *H01L 23/49811* (2013.01); *H01L 24/16* (2013.01); *H01L 24/81* (2013.01); *H01L 23/3114* (2013.01); *H01L 23/3128* (2013.01); *H01L 2224/0401* (2013.01); *H01L 2224/05111* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05164* (2013.01); *H01L 2224/05166* (2013.01); *H01L 2224/05169* (2013.01); *H01L 2224/05171* (2013.01); *H01L 2224/05186* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05666* (2013.01); *H01L 2224/1132* (2013.01); *H01L 2224/1145* (2013.01); *H01L 2224/1146* (2013.01); *H01L 2224/11334* (2013.01); *H01L 2224/11472* (2013.01); *H01L 2224/11474* (2013.01);
(Continued)

(58) Field of Classification Search
CPC ......... H01L 24/81; H01L 24/82; H01L 24/12; H01L 24/16; H01L 24/163
USPC .......................................... 438/612, 613, 614
See application file for complete search history.

(56) References Cited

U.S. PATENT DOCUMENTS

| 5,705,858 | A | 1/1998 | Tsukamoto | |
| 6,546,620 | B1 * | 4/2003 | Juskey et al. | ................... 29/840 |

(Continued)

*Primary Examiner* — Bradley K Smith
(74) *Attorney, Agent, or Firm* — Robert D. Atkins; Patent Law Group: Atkins and Associates, P.C.

(57) ABSTRACT

A semiconductor device has a semiconductor die mounted to a substrate. A plurality of conductive pillars is formed over a semiconductor die. A plurality of conductive protrusions is formed over the conductive pillars. Bumps are formed over the conductive protrusions and conductive pillars. Alternatively, the conductive protrusions are formed over the substrate. A conductive layer is formed over the substrate. The semiconductor die is mounted to the substrate by reflowing the bumps at a temperature that is less than a melting point of the conductive pillars and conductive protrusions to metallurgically and electrically connect the bumps to the conductive layer while maintaining a fixed offset between the semiconductor die and substrate. The fixed offset between the semiconductor die and substrate is determined by a height of the conductive pillars and a height of the conductive protrusions. A mold underfill material is deposited between the semiconductor die and substrate.

15 Claims, 15 Drawing Sheets

(51) Int. Cl.
*H01L 23/498* (2006.01)
*H01L 23/31* (2006.01)

(52) U.S. Cl.
CPC . *H01L2224/11903* (2013.01); *H01L 2224/131* (2013.01); *H01L 2224/13076* (2013.01); *H01L 2224/13082* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13147* (2013.01); *H01L 2224/13155* (2013.01); *H01L 2224/13166* (2013.01); *H01L 2224/13184* (2013.01); *H01L 2224/16238* (2013.01); *H01L 2224/2919* (2013.01); *H01L 2224/32225* (2013.01); *H01L 2224/73204* (2013.01); *H01L 2224/73265* (2013.01); *H01L 2224/81191* (2013.01); *H01L 2224/81193* (2013.01); *H01L 2224/81815* (2013.01); *H01L 2224/83104* (2013.01); *H01L 2224/94* (2013.01); *H01L 2924/01322* (2013.01); *H01L 2924/12041* (2013.01); *H01L 2924/1306* (2013.01); *H01L 2924/13091* (2013.01); *H01L 2924/15311* (2013.01)

(56) References Cited

U.S. PATENT DOCUMENTS

| | | | |
|---|---|---|---|
| 7,569,935 | B1 | 8/2009 | Fan |
| 7,847,417 | B2 | 12/2010 | Araki et al. |
| 2005/0208751 | A1* | 9/2005 | Oh et al. ............... 438/614 |
| 2006/0113681 | A1* | 6/2006 | Jeong et al. ............ 257/780 |
| 2009/0014852 | A1 | 1/2009 | Lee |
| 2009/0236738 | A1* | 9/2009 | Shim et al. ............ 257/737 |
| 2009/0302469 | A1 | 12/2009 | Masuda et al. |
| 2010/0314745 | A1* | 12/2010 | Masumoto et al. ...... 257/692 |
| 2011/0049703 | A1 | 3/2011 | Hsu et al. |

* cited by examiner

SEMICONDUCTOR DEVICE AND METHOD OF FORMING CONDUCTIVE PROTRUSION OVER CONDUCTIVE PILLARS OR BOND PADS AS FIXED OFFSET VERTICAL INTERCONNECT STRUCTURE

FIELD OF THE INVENTION

The present invention relates in general to semiconductor devices and, more particularly, to a semiconductor device and method of forming conductive protrusions over conductive pillars or bond pads as a fixed offset vertical interconnect structure for a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional flipchip semiconductor package, such as a flexible ball grid array (FBGA), can include a semiconductor die with conductive bumps formed over contact pads on an active surface of the die. The semiconductor die is mounted to a substrate by reflowing the bumps to establish a metallurgical and electrical connection with the substrate. However, unless precise alignment between the bumps and the bond pads is maintained, bridging defects or electrical shorts can occur between the bumps and adjacent conductive traces. In addition, the temperature and pressure during reflow is known to cause the molten bump material to flow laterally and potentially contact adjacent conductive traces, resulting in bridging defects or short circuit conditions. These defects from electrical shorts lower manufacturing yield and increase cost.

Once the semiconductor die has been mounted to the substrate, an underfill material or encapsulant can be deposited between the die and substrate. Another concern with flipchip packages is that a gap between the semiconductor die and substrate may narrow from the reflow temperature and pressure and inhibit the flow of the underfill material. Voids can form in the underfill material between the semiconductor die and substrate. The void defects from an insufficient underfill gap can also lower manufacturing yield and increase cost.

As an illustration of the above defects, FIG. 1a shows a conventional semiconductor die 10 with contact pads 12 formed over active surface 14 of the semiconductor die. An insulating layer 16 is formed over contact pads 12 and active surface 14. A portion of insulating layer 16 is removed to expose contact pads 12. An under bump metallization (UBM) layer 18 is formed over contact pads 12 and insulating layer 16. Conductive pillars 20 are formed over UBM layer 18. Bumps or caps 22 are formed over conductive pillars 20. Semiconductor die 10 is positioned over substrate 24 with bumps 22 aligned to contact pads 26 on the substrate.

In FIG. 1b, semiconductor die 10 is mounted to substrate 24 with bumps 22 metallurgically and electrically connected to contact pads 26 by a reflow or compression. A distance D1 between semiconductor die 10 and substrate 24 represents an underfill gap. During the reflow process, the underfill gap is known to narrow with elevated temperature and pressure causing the molten bump material to flow laterally and potentially contact adjacent conductive traces 28 and create a bridging defect or short circuit condition. Bridging defects are particularly prevalent in fine pitch interconnect applications.

FIGS. 1c and 1d illustrate how misalignment between bumps 22 and contact pads 26 can increase the occurrence of bridging defects. In FIG. 1c, a centerline of bump 22 is offset or misaligned from a centerline of contact pad 26 by a distance D2. As shown in FIG. 1d, bumps 22 may contact an adjacent conductive trace 28 during reflow because of misalignment D2. The bridging defects between bumps 22 and adjacent conductive traces 28 reduce manufacturing yield and increase cost.

SUMMARY OF THE INVENTION

A need exists for a simple and cost effective vertical electrical interconnect of a semiconductor die. Accordingly, in one embodiment, the present invention is a method of making a semiconductor device comprising the steps of providing a semiconductor die, forming a plurality of conductive pillars over the semiconductor die, forming a plurality of conductive protrusions over the conductive pillars, forming bumps over the conductive protrusions and conductive pillars, providing a substrate, forming a conductive layer on the substrate, and mounting the semiconductor die to the substrate by reflowing the bumps at a temperature that is less than a melting point of the conductive pillars and conductive protrusions to metallurgically and electrically connect the bumps to the conductive layer while maintaining a fixed offset between the semiconductor die and substrate.

In another embodiment, the present invention is a method of making a semiconductor device comprising the steps of providing a first substrate, forming a conductive pillar over the first substrate, forming a bump over the conductive pillar, providing a second substrate, forming a conductive protrusion over the second substrate, and mounting the first substrate to the second substrate by reflowing the bump at a temperature that is less than a melting point of the conductive pillar and conductive protrusion to metallurgically and electrically connect the bump to the conductive protrusion while maintaining a fixed offset between the first substrate and second substrate.

In another embodiment, the present invention is a method of making a semiconductor device comprising the steps of providing a first substrate, providing a second substrate, forming a conductive protrusion over the first substrate, forming a bump over the second substrate or conductive protrusion, and mounting the first substrate to the second substrate by reflowing the bump at a temperature that is less than a melting point of the conductive protrusion to metallurgically and electrically connect the first substrate to the second substrate while maintaining a fixed offset between the first substrate and second substrate.

In another embodiment, the present invention is a semiconductor device comprising a substrate and semiconductor die mounted to the substrate. A bump structure is disposed between the semiconductor die and substrate to electrically connect the semiconductor die to the substrate. The bump structure includes a conductive protrusion disposed between the semiconductor die and substrate, and a bump formed around the conductive protrusion. The bump structure maintains a fixed offset between the semiconductor die and substrate.

DETAILED DESCRIPTION OF THE DRAWINGS

Figure 1A:
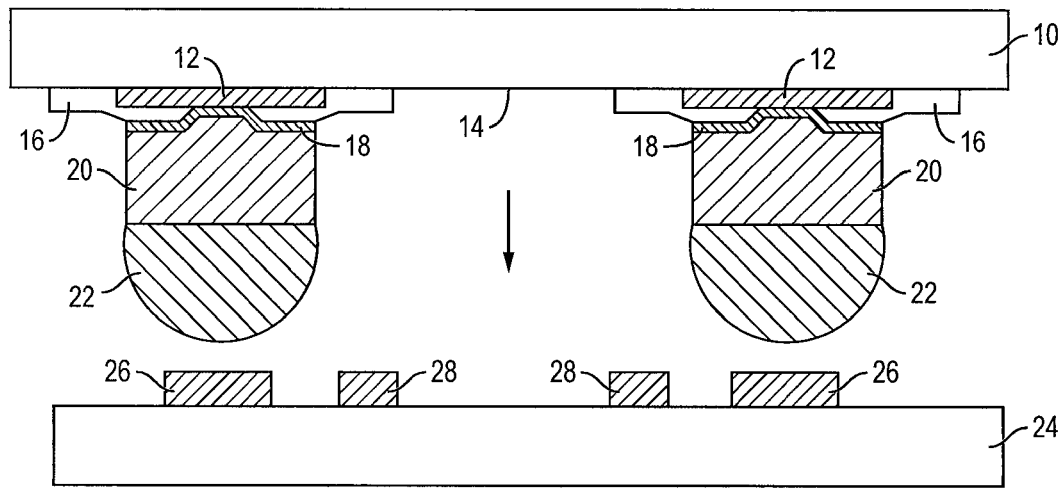
FIGS. 1a-1d illustrate a conventional semiconductor die with bridging defects between bumps and adjacent conductive traces.
Figure 1B:
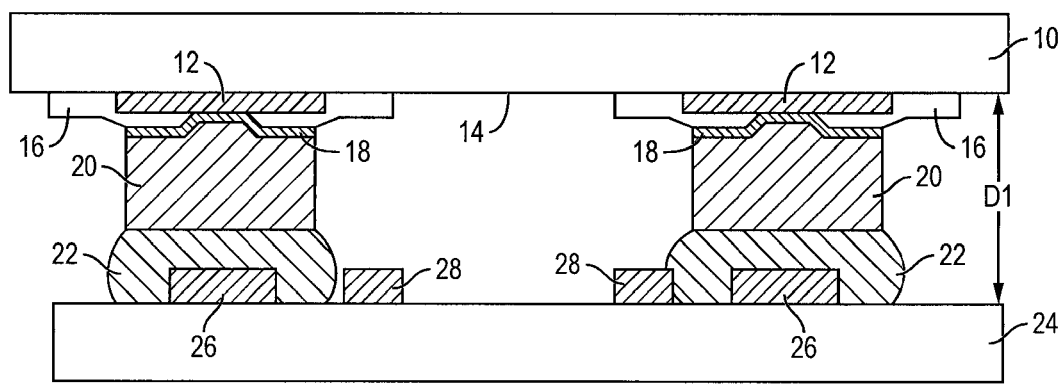
Figure 1C:
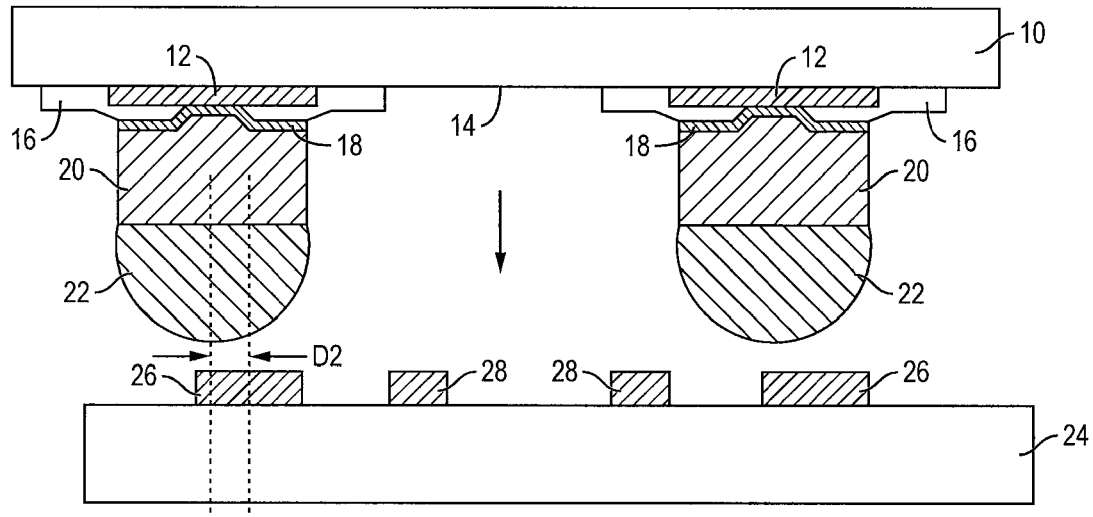
Figure 1D:
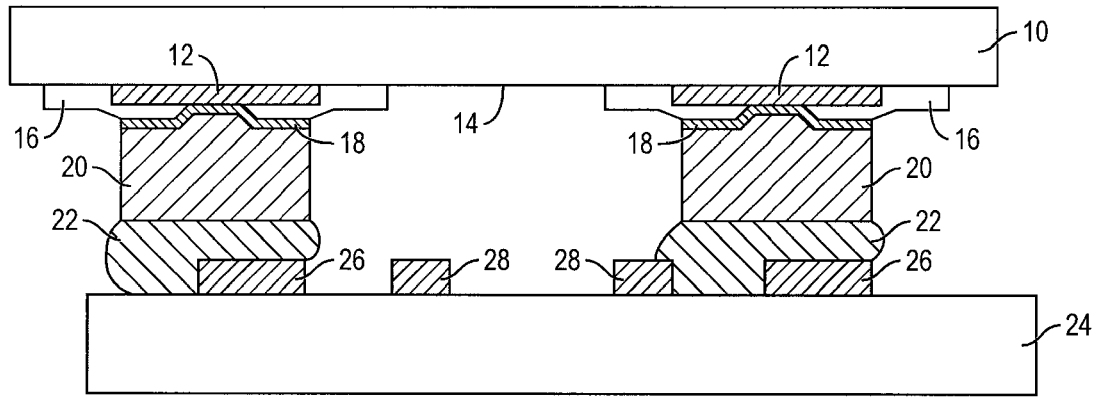

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photo resist or positive-acting photo resist. Second, the photoresist layer is transferred into the wafer surface. The transfer occurs when etching removes the portion of the top layers of semiconductor wafer not covered by the photoresist. The chemistry of photoresists is such that the photoresist dissolves slowly and resists removal by chemical etching solutions while the portion of the top layers of the semiconductor wafer not covered by the photoresist is removed more rapidly. The process of forming, exposing, and removing the photoresist, as well as the process of removing a portion of the semiconductor wafer can be modified according to the particular resist used and the desired results.

In negative-acting photo resists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photo resists, photoresist is exposed to light and is changed from relatively nonsoluble condition to much more soluble condition in a process known as photosolubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 2:
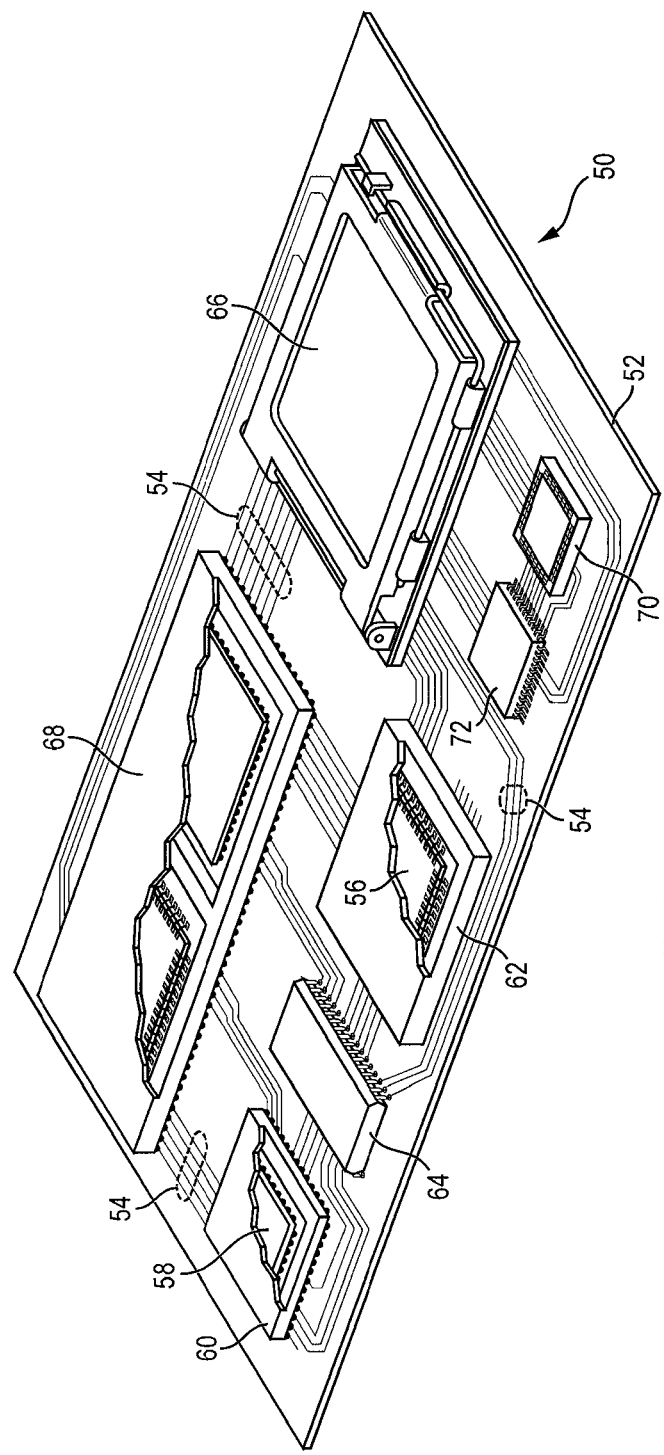
FIG. 2 illustrates a PCB with different types of packages mounted to its surface.

FIG. 2 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 2 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 2, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 3A:
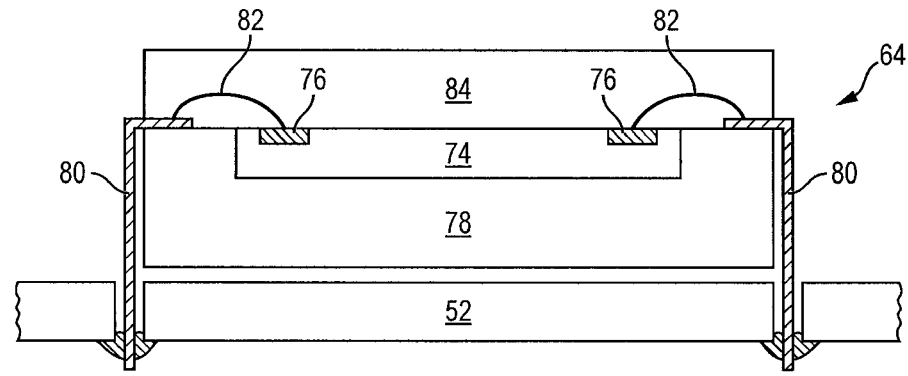
FIGS. 3a-3c illustrate further detail of the representative semiconductor packages mounted to the PCB.
Figure 3B:
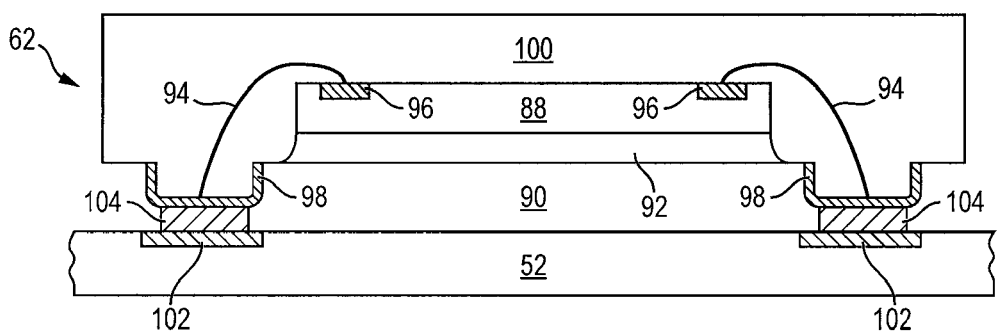
Figure 3C:
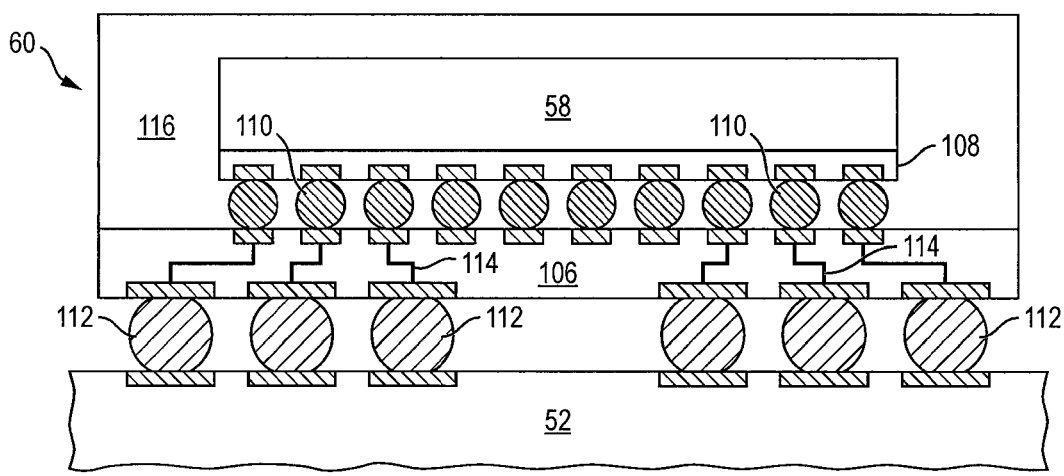

FIGS. 3a-3c show exemplary semiconductor packages. FIG. 3a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 3b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 3c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 4A:
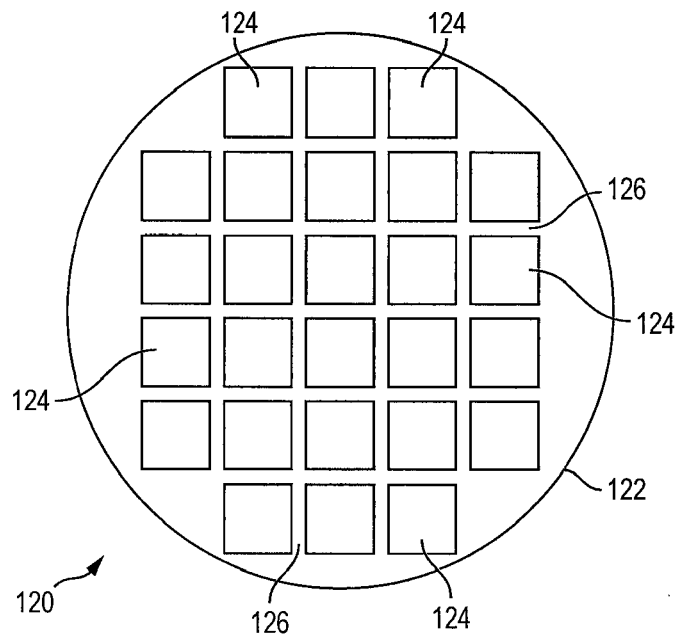
FIGS. 4a-4k illustrate a process of forming conductive protrusions over conductive pillars as fixed offset vertical interconnect structures of a semiconductor die.

FIGS. 4a-4k illustrate, in relation to FIGS. 2 and 3a-3c, a process of forming conductive protrusions over conductive pillars as fixed offset vertical interconnect structures of a semiconductor die. FIG. 4a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 4B:
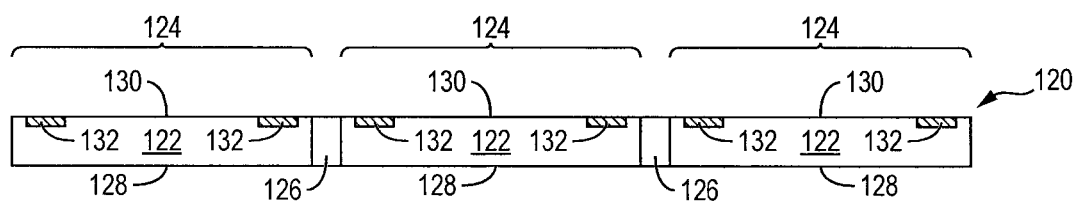

FIG. 4b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed using a patterning and metal deposition process such as printing, PVD, CVD, sputtering, electrolytic plating, and electroless plating. Conductive layer 132 can be one or more layers of Al, Cu, Sn, Ti, Ni, Au, Ag, or other suitable electrically conductive material. Conductive layer 132 operates as contact pads that are electrically connected to the circuits on active surface 130 of semiconductor wafer 120. Contact pads 132 can be disposed a first distance from the edge of semiconductor die 124, as shown in FIG. 4b. Alternatively, contact pads 132 can be offset in multiple rows such that a first row of contact pads is disposed a first distance from the edge of the die, and a second row of contact pads alternating with the first row is disposed a second distance from the edge of the die. In one embodiment, conductive layer 132 can have a circular, rectangular, or other suitable shape.

Figure 4C:
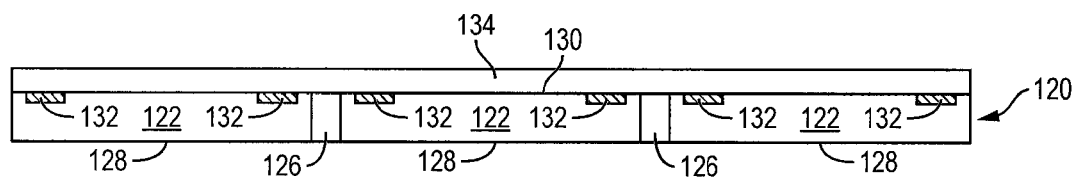
Figure 4D:
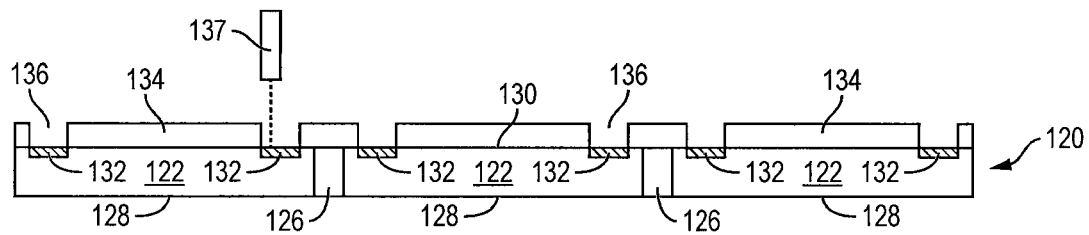

In FIG. 4c, a patterning or photoresist layer 134 is formed over active surface 130 and conductive layer 132 using printing, spin coating, or spray coating. In some embodiments that utilize an insulating layer for patterning, the insulating layer can include one or more layers of silicon dioxide (SiO2), silicon nitride (Si3N4), silicon oxynitride (SiON), tantalum pentoxide (Ta2O5), aluminum oxide (Al2O3), or other material having similar structural properties. A portion of photoresist layer 134 is removed by an etching process to form vias 136 that extend down to and expose conductive layer 132, as shown in FIG. 4d. Alternatively, vias 136 are formed by laser direct ablation (LDA) using laser 137. In one embodiment, vias 136 have a width of 40-85 micrometers (μm) and depth of 20-45 μm.

Figure 4E:
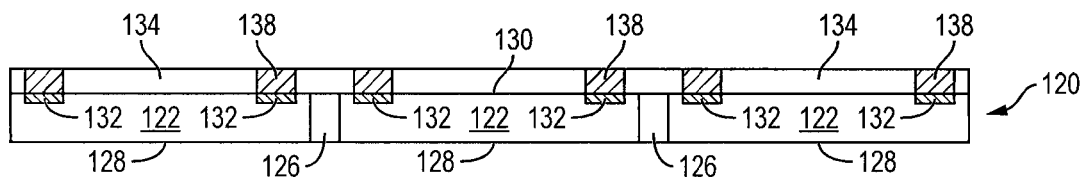

In FIG. 4e, an electrically conductive material is deposited into vias 136 over conductive layer 132 using a patterning and metal deposition process such as printing, sputtering, electrolytic plating, and electroless plating to form conductive pillars 138. The conductive material can be one or more layers of Al, Cu, Sn, Ti, Ni, Au, Ag, tungsten (W), or other suitable electrically conductive material. Conductive pillars 138 are electrically connected to conductive layer 132.

Conductive pillars 138 can include a multiple metal stack having an adhesion layer, a barrier layer, and a seed or wetting layer. An adhesion layer is formed over conductive layer 132 and can be titanium (Ti), titanium nitride (TiN), titanium tungsten (TiW), Al, or chromium (Cr). A barrier layer is formed over an adhesion layer and can be Ni, NiV, platinum (Pt), palladium (Pd), TiW, or chromium copper (CrCu). A barrier layer inhibits diffusion of Cu into active areas of the die. A seed layer can be Cu, Ni, NiV, Au, or Al. A seed layer is formed over a barrier layer and acts as an intermediate conductive layer between conductive layer 132 and conductive pillars 138.

Figure 4F:
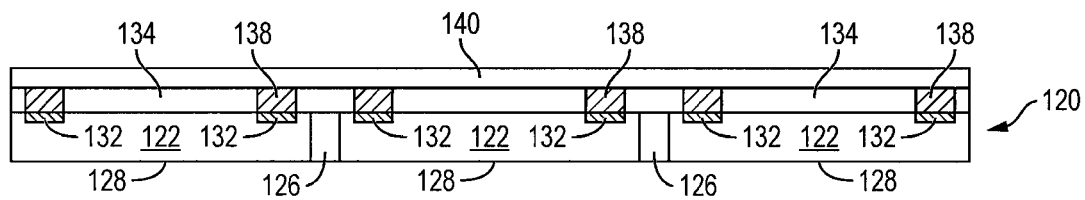
Figure 4G:
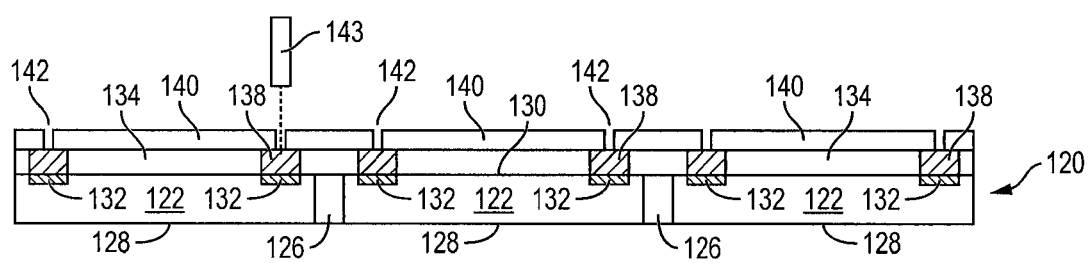

In FIG. 4f, a patterning or photoresist layer 140 is formed over photoresist layer 134 and conductive pillars 138 using printing, spin coating, or spray coating. In some embodiments that utilize an insulating layer for patterning, the insulating layer can include one or more layers of SiO2, Si3N4, SiON, Ta2O5, Al2O3, or other material having similar structural properties. A portion of photoresist layer 140 is removed by an etching process to form vias 142 that expose conductive pillars 138, as shown in FIG. 4g. Alternatively, vias 142 are formed by LDA using laser 143. A width of vias 142 is less than a width of conductive pillars 138. Vias 142 are disposed substantially over a centerline of conductive pillars 138. In other embodiments, vias 142 can be offset relative to a centerline of conductive pillars 138.

Figure 4H:
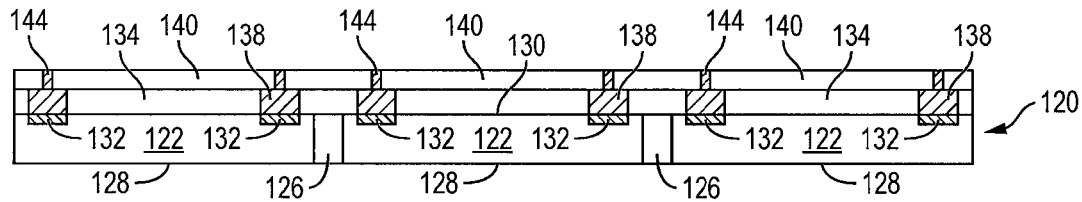

In FIG. 4h, an electrically conductive material is deposited into vias 142 over conductive pillars 138 using a patterning and metal deposition process such as printing, sputtering, electrolytic plating, or electroless plating. The conductive material can be one or more layers of Al, Cu, Sn, Ni, Au, Ag, Ti, W, or other suitable electrically conductive material to form conductive protrusions 144. Conductive protrusions 144 are electrically connected to conductive pillars 138 and conductive layer 132. An optional backgrinding process can be performed to planarize upper surfaces of conductive protrusions 144 and photoresist layer 140.

Figure 4I:
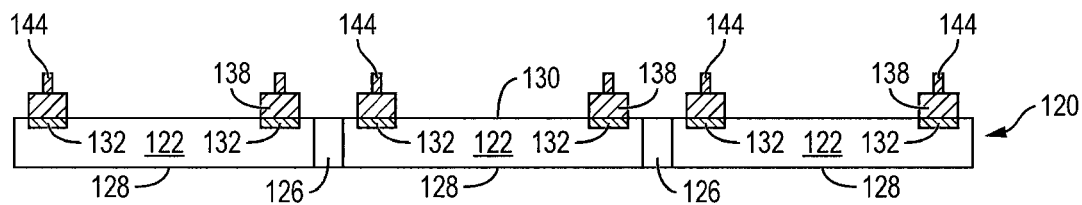

In FIG. 4i, the remaining portions of photoresist layers 134 and 140 are removed by a chemical stripping process to expose active surface 130, conductive pillars 138, and conductive protrusions 144. A height of conductive protrusions 144 can be less than or greater than a height of conductive pillars 138. In one embodiment, the height of conductive protrusions 144 is 5-20 μm, and the height of conductive pillars 138 is 20-45 μm.

Figure 4J:
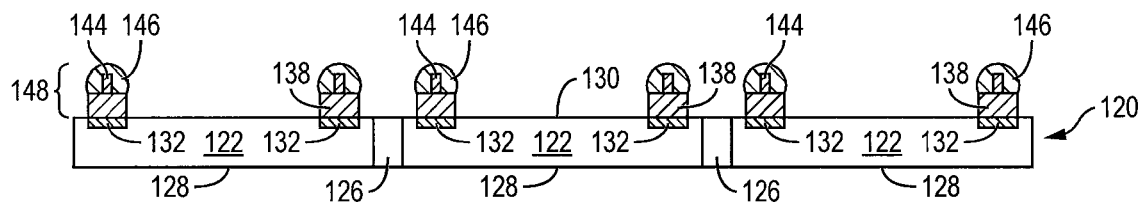

In FIG. 4j, an electrically conductive bump material is deposited over conductive pillars 138 and conductive protrusions 144 using an evaporation, electrolytic plating, electroless plating, ball drop, or screen printing process. The bump material can be Al, Sn, Ni, Au, Ag, Pb, bismuth (Bi), Cu, solder, and combinations thereof, with an optional flux solution. For example, the bump material can be eutectic Sn/Pb, high-lead solder, or lead-free solder. The electrically conductive bump material is bonded to conductive pillars 138 and conductive protrusions 144 using a suitable attachment or bonding process. In one embodiment, the conductive bump material is reflowed by heating the material above its melting point to form balls or bumps 146. In some applications, bumps 146 are reflowed a second time to improve electrical contact to conductive pillars 138 and conductive protrusions 144.

Each of the conductive pillars 138, together with their associated conductive protrusions 144, and associated bumps 146 constitute a column bump structure 148. In particular, the melting point of bumps 146 is less than the melting point of conductive pillars 138 and conductive protrusions 144. The reflow temperature is selected to have a value greater than the melting point of bumps 146 and less than the melting point of conductive pillars 138 and conductive protrusions 144. Accordingly, bumps 146 melt during reflow while conductive pillars 138 and conductive protrusions 144 remain solid. Bump structure 148 maintains a fixed offset as determined by the height of conductive pillars 138 and conductive protrusions 144 during reflow. Any number of column bump structures 148 can be formed over semiconductor wafer 120.

Figure 4K:
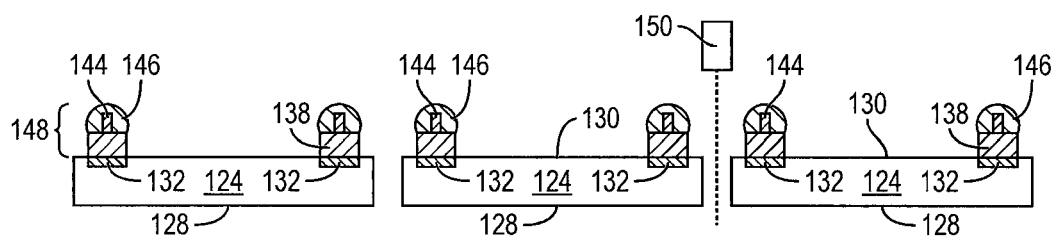

In FIG. 4k, semiconductor wafer 120 is singulated through saw streets 126 using a saw blade or laser cutting tool 150 into individual semiconductor die 124.

Figure 5A:
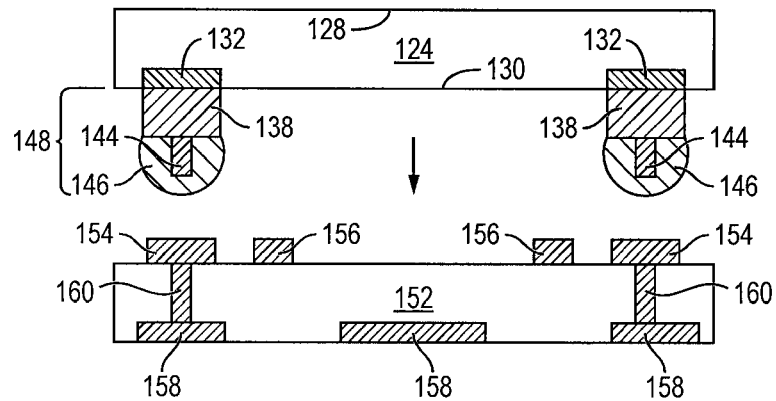
FIGS. 5a-5c illustrate the semiconductor die with conductive protrusions formed over conductive pillars as fixed offset vertical interconnect structures.

In FIG. 5a, a PCB or substrate 152 provides structural support and electrical interconnect for semiconductor die 124. Substrate 152 can be silicon, polymer, beryllium oxide, woven glass and epoxy, or other suitable material. Conductive bond pads 154 and conductive traces 156 are formed over a surface or within layers of substrate 152 using evaporation, electrolytic plating, electroless plating, screen printing, or other suitable metal deposition process. Conductive traces 156 provide for electrical signal transmission between semiconductor die 124, mounted discrete devices, and other external components. Conductive traces 156 also provide power and ground connections to semiconductor die 124.

A plurality of conductive vias 160 is formed through substrate 152. To form conductive vias 160, a plurality of vias is formed through substrate 152 by laser drilling, mechanical drilling, or a deep reactive ion etching (DRIE). The vias are filled with Al, Cu, Sn, Ni, Au, Ag, Ti, W, or other suitable electrically conductive material using electrolytic plating, electroless plating process, or other suitable metal deposition process to form conductive vias 160. Conductive vias 160 are electrically connected to bond pads 154 and conductive traces 156.

An electrically conductive layer or RDL 158 is formed over a surface or within layers of substrate 152 and conductive vias 160 opposite bond pads 154 and conductive traces 156 using a patterning and metal deposition process such as printing, PVD, CVD, sputtering, electrolytic plating, and electroless plating. Conductive layer 158 can be one or more layers of Al, Cu, Sn, Ni, Au, Ag, or other suitable electrically conductive material. Conductive layer 158 is electrically connected to conductive vias 160, bond pads 154, and conductive traces 156.

Semiconductor die 124 is positioned over substrate 152 with active surface 130 oriented facing towards the substrate and bumps 174 aligned with bond pads 154. Semiconductor die 124 is brought together with substrate 152 such that column bump structures 148, and in particular bumps 146, contact corresponding bond pads 154 on substrate 152.

Figure 5B:
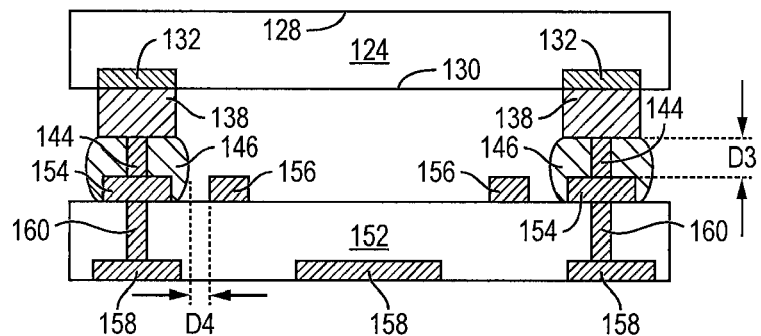

In FIG. 5b, semiconductor die 124 is metallurgically and electrically connected to substrate 152 by reflowing bumps 146 to create an electrical and mechanical interconnection with bond pads 154. In particular, the reflow temperature is greater than the melting point of bumps 146 and less than the melting temperature of conductive pillars 138 and conductive protrusions 144. In a flipchip arrangement, semiconductor die 124 provides a short electrical conduction path from active devices on active surface 130 to bond pads 154 and conductive traces 156 on substrate 152 in order to reduce signal propagation, lower capacitance, and achieve overall better circuit performance.

Conductive pillars 138 and conductive protrusions 144 of column bump structure 148 remain solid during the reflow of bumps 146 because the reflow temperature is less than the melting point of conductive pillars 138 and conductive protrusions 144. Having the reflow temperature less than the melting point of conductive pillars 138 and conductive protrusions 144 ensures that the conductive pillars and conductive protrusions remain solid during reflow of bumps 146. Conductive protrusions 144 therefore maintain conductive pillars 138 at a minimum distance D3 from bond pads 154 during reflow of bumps 146. Bump structure 148 maintains a fixed offset between semiconductor die 124 and substrate 152 as determined by the height of conductive pillars 138 and conductive protrusions 144.

By maintaining the minimum distance D3 between conductive pillars 138 and bond pads 154 with the fixed offset, a sufficient underfill gap is maintained between a lower surface of semiconductor die 124 and an upper surface of substrate 152. The underfill gap is the sum of the height of conductive pillar 138, and height of conductive protrusion 144, and thickness of bond pad 154. The fixed offset of conductive pillars 138 and conductive protrusions 144 reduces pressure that would otherwise cause outward movement of bump material in a lateral direction toward adjacent conductive traces 156 during reflow. Bumps 146 also tend to coalesce around the solid conductive protrusions 144 while in the molten state. Accordingly, bumps 146 remain a minimum lateral distance D4 from conductive traces 156 to reduce occurrences of bridging defects or short circuit conditions.

Figure 5C:
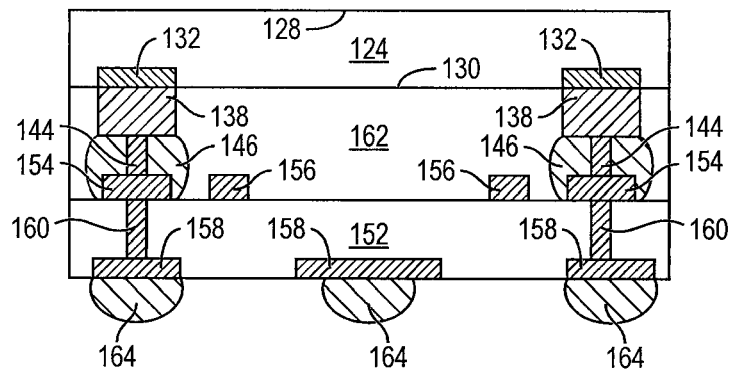
Figure 10A:
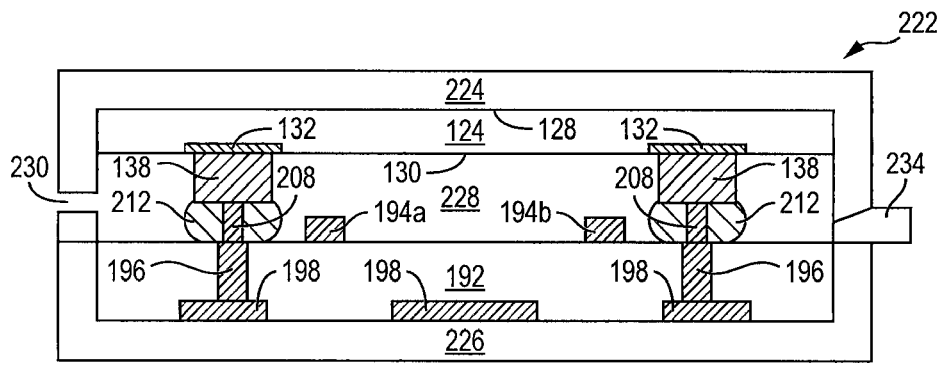
FIGS. 10a-10c illustrate a mold underfill process for encapsulating flipchip packages having fixed offset vertical interconnect structures.
Figure 10B:
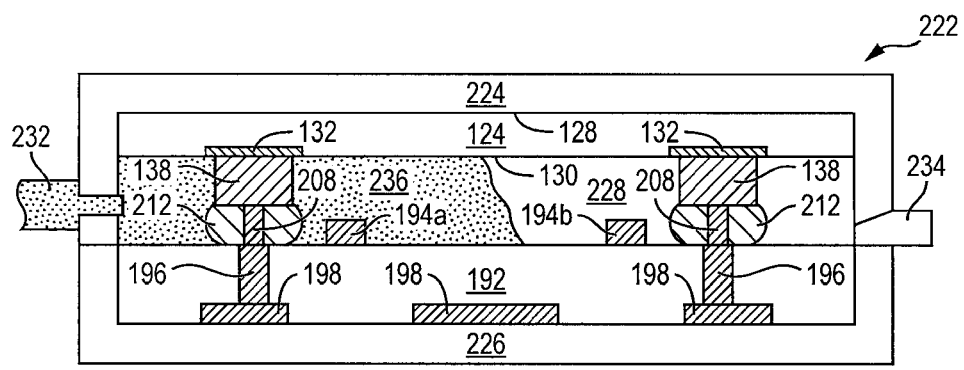
Figure 10C:
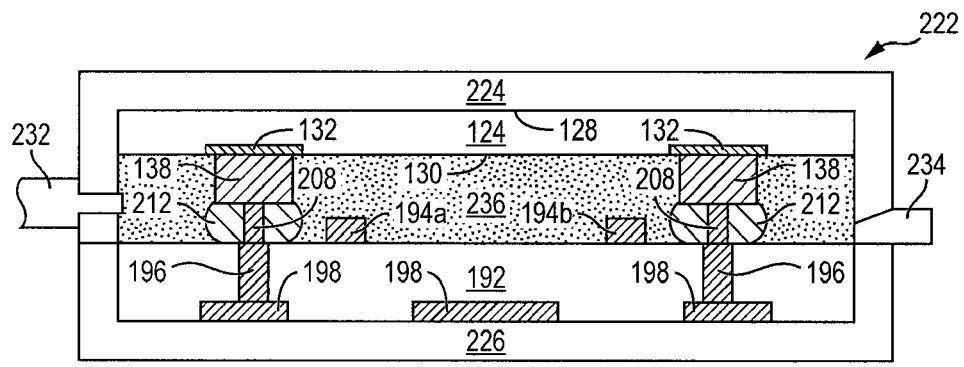

In FIG. 5c, an underfill material 162 is deposited between semiconductor die 124 and substrate 152 to uniformly fill the gap between the semiconductor die and substrate, see FIGS. 10a-10c. Underfill material 162 can include epoxy, epoxy-resin adhesive material, polymeric materials, films, or other non-conductive materials. Underfill material 162 is non-conductive and environmentally protects the semiconductor device from external elements and contaminants.

An electrically conductive bump material is deposited over conductive layer 158 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 158 using a suitable attachment or bonding process. In one embodiment, the bump material is reflowed by heating the material above its melting point to form spherical balls or bumps 164. In some applications, bumps 164 are reflowed a second time to improve electrical contact with conductive layer 158. In one embodiment, bumps 164 are formed over a UBM layer having a wetting layer, barrier layer, and adhesive layer. Bumps 164 can also be compression bonded to conductive layer 158. Bumps 164 represent one type of interconnect structure that can be formed over conductive layer 158. The interconnect structure can also use bond wires, conductive paste, stud bump, micro bump, or other electrical interconnect.

Figure 6A:
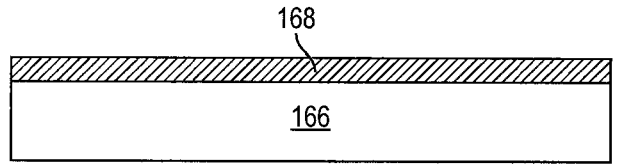
FIGS. 6a-6i illustrate a process of forming conductive protrusions over a conductive layer as fixed offset vertical interconnect structures of a semiconductor die.

FIGS. 6a-6i illustrate, in relation to FIGS. 2 and 3a-3c, a process of forming conductive protrusions over a conductive layer as fixed offset vertical interconnect structures of a semiconductor die. In FIG. 6a, a PCB or substrate 166 provides structural support and electrical interconnect of semiconductor die. Substrate 166 can be silicon, polymer, beryllium oxide, woven glass and epoxy, or other suitable material.

An electrically conductive layer or RDL 168 is formed over substrate 166 using a patterning and metal deposition process such as printing, PVD, CVD, sputtering, electrolytic plating, and electroless plating. Conductive layer 168 can be one or more layers of Al, Cu, Sn, Ni, Au, Ag, or other suitable electrically conductive material. Conductive layer 168 can also be formed over substrate 166 by bonding a dry film or foil to substrate 166. In embodiments that utilize a Cu film as the conductive layer 168, a combination of substrate 166 and Cu conductive layer 168 can be referred to as a CCL.

Figure 6B:
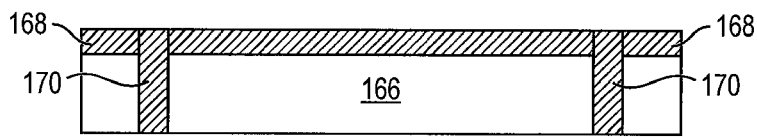

In FIG. 6b, a plurality of conductive vias 170 is formed through conductive layer 168 and substrate 166. To form conductive vias 170, a plurality of vias is formed through conductive layer 168 and substrate 166 by laser drilling, mechanical drilling, or DRIE. The vias are filled with Al, Cu, Sn, Ni, Au, Ag, Ti, W, or other suitable electrically conductive material using electrolytic plating, electroless plating process, or other suitable metal deposition process to form conductive vias 170. Conductive vias 170 are electrically connected to conductive layer 168.

Figure 6C:
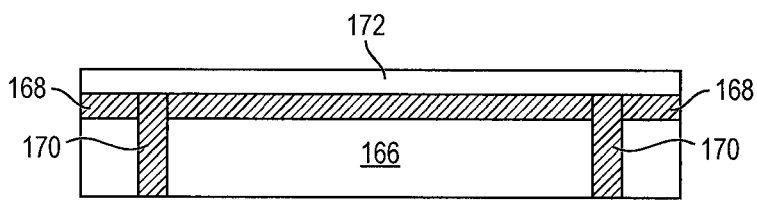

In FIG. 6c, a patterning or photoresist layer 172 is formed over conductive layer 168 and conductive vias 170 using printing, spin coating, or spray coating. Photoresist layer 172 can be a dry film photoresist layer that is applied to conductive layer 168 by a dry film lamination process. In embodiments that utilize an insulating layer for patterning, the insulating layer can include one or more layers of $SiO_2$, Si3N4, SiON, Ta2O5, Al2O3, or other material having similar insulating and structural properties.

Figure 6D:
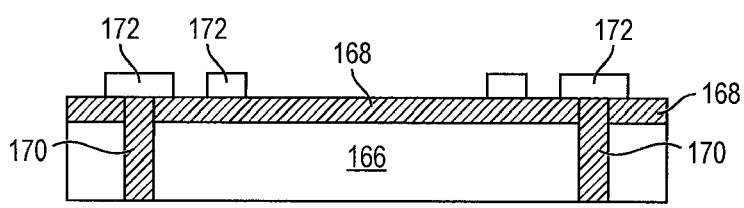

In FIG. 6d, a portion of photoresist layer 172 is exposed and removed by an etching process. An unexposed portion of photoresist layer 172 remains on conductive layer 168. The remaining portion of photoresist layer 172 forms a mask that is used in a subsequent etching process of conductive layer 168.

Figure 6E:
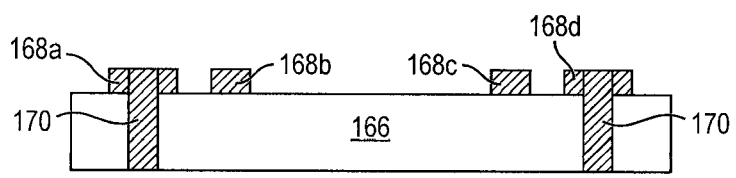

In FIG. 6e, a portion of conductive layer 168 is removed by an etching process to form bond pads 168a and 168d and conductive traces 168b and 168c. After bond pads 168a and 168d and conductive traces 168b and 168c are formed, the remaining portions of photoresist layers 134 and 140 are removed by a chemical stripping process from upper surfaces of bond pads 168a and 168d and conductive traces 168b and 168c.

Figure 6F:
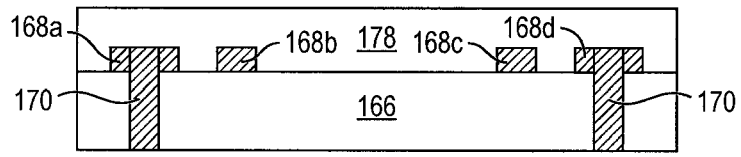

In FIG. 6f, a patterning or photoresist layer 178 is formed over substrate 166, bond pads 168a and 168d, and conductive traces 168b and 168c using printing, spin coating, or spray coating. Photoresist layer 178 can be a dry film photoresist layer that is applied to substrate 166 by a dry film lamination process. In embodiments that utilize an insulating layer for patterning, the insulating layer can include one or more layers of SiO2, Si3N4, SiON, Ta2O5, Al2O3, or other material having similar insulating and structural properties.

Figure 6G:
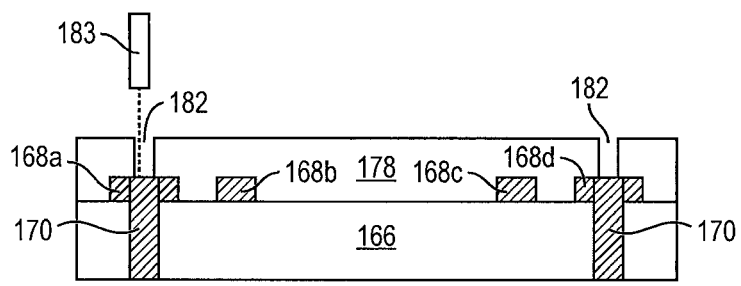

In FIG. 6g, a portion of photoresist layer 178 is exposed and removed by an etching process to form vias 182 and expose bond pads 168a and 168d. Alternatively, vias 182 are formed by LDA using laser 183. A width of vias 182 is less than a width of bond pads 168a and 168d. Vias 182 are disposed substantially over a centerline of bond pads 168a and 168d. In other embodiments, vias 182 can be offset relative to a centerline of bond pads 168a and 168d.

Figure 6H:
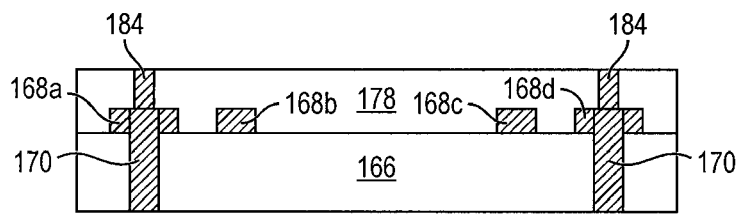

In FIG. 6h, an electrically conductive material is deposited in vias 182 using a deposition process such as electrolytic plating and electroless plating to form conductive protrusions 184. Conductive protrusions 184 can be one or more layers of Al, Cu, Sn, Ni, Au, Ag, Ti, W, or other suitable electrically conductive material. Conductive protrusions 184 are electrically connected to bond pads 168a and 168d. An optional backgrinding process can be performed to planarize upper surfaces of conductive protrusions 184 and photoresist layer 178. In one embodiment, a height of conductive protrusions 184 is 5-20 μm.

Figure 6I:
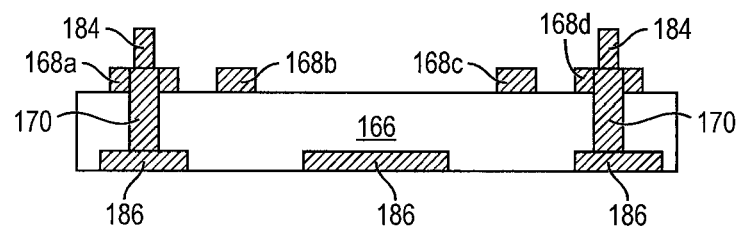

In FIG. 6i, the remaining portions of photoresist layer 172 are removed by a chemical stripping process from upper surfaces of bond pads 168a and 168d and conductive traces 168b and 168c. An electrically conductive layer or RDL 186 is formed over a surface or within layers of substrate 166 and conductive vias 170 opposite conductive protrusions 184 using a patterning and metal deposition process such as printing, sputtering, electrolytic plating, and electroless plating. Conductive layer 186 can be one or more layers of Al, Cu, Sn, Ni, Au, Ag, or other suitable electrically conductive material. Conductive layer 186 is electrically connected to conductive vias 170.

Figure 7A:
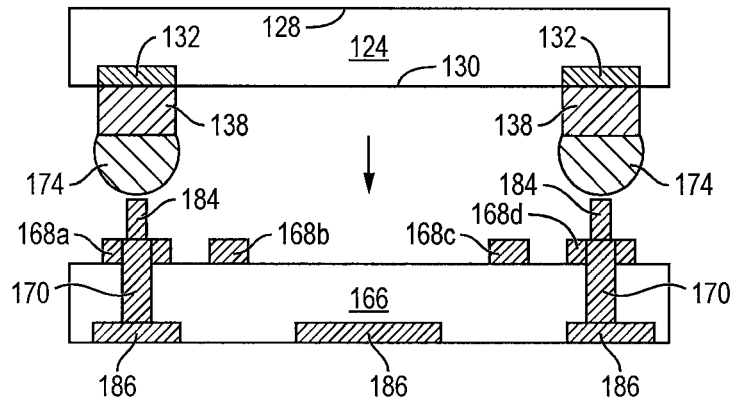
FIGS. 7a-7c illustrate the semiconductor die with conductive protrusions formed over a conductive layer as fixed offset vertical interconnect structures.

Continuing from FIG. 4e, semiconductor die 124 has conductive pillars 138 formed over conductive layer 132, as shown in FIG. 7a. Bumps 174 are formed over conductive pillars 138. Semiconductor die 124 is positioned over substrate 166 with active surface 130 oriented towards the substrate and bumps 174 aligned with bond pads 168a and 168d. Semiconductor die 124 is brought together with substrate 166 such that bumps 174 contact corresponding bond pads 168a and 168d on the substrate.

Figure 7B:
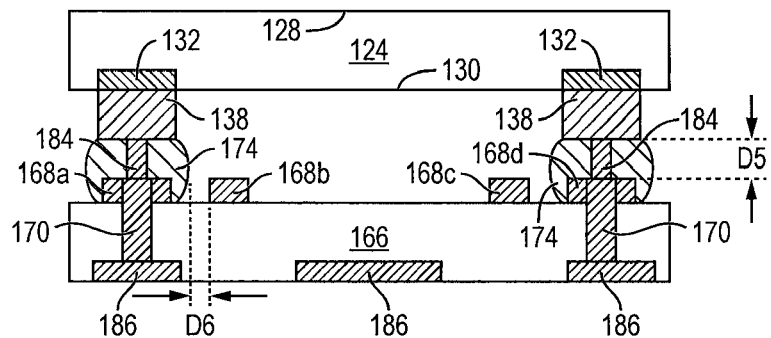

In FIG. 7b, semiconductor die 124 is metallurgically and electrically connected to substrate 166 by reflowing bumps 174 to create an electrical and mechanical interconnection with bond pads 168a and 168d. In particular, the reflow temperature is greater than the melting point of bumps 174 and less than the melting temperature of conductive pillars 138 and conductive protrusions 184. In a flipchip arrangement, semiconductor die 124 provides a short electrical conduction path from active devices on active surface 130 to bond pads 168a and 168d and conductive traces 168b and 168c on substrate 166 in order to reduce signal propagation, lower capacitance, and achieve overall better circuit performance.

Conductive pillars 138 and conductive protrusions 184 remain solid during the reflow of bumps 174 because the reflow temperature is less than the melting point of conductive pillars 138 and conductive protrusions 184. Having the reflow temperature less than the melting point of conductive pillars 138 and conductive protrusions 184 ensures that the conductive pillars and conductive protrusions remain solid during reflow of bumps 174. Conductive protrusions 184 therefore maintain conductive pillars 138 at a minimum distance D5 from bond pads 168a and 168d during reflow of bumps 174. The height of conductive pillars 138 and conductive protrusions 184 maintains a fixed offset between semiconductor die 124 and substrate 166.

By maintaining the minimum distance D5 between conductive pillars 138 and bond pads 168a and 168d with the fixed offset, a sufficient underfill gap is maintained between a lower surface of semiconductor die 124 and an upper surface of substrate 166. The underfill gap is the sum of the height of conductive pillar 138 and height of conductive protrusion 184, and thickness of bond pads 168a and 168d. The fixed offset of conductive pillars 138 and conductive protrusions 184 reduces pressure that would otherwise cause outward movement of bump material in a lateral direction toward adjacent conductive traces 168b and 168c during reflow. Bumps 174 also tend to coalesce around the solid conductive protrusions 184 while in the molten state. Accordingly, bumps 174 remain a minimum lateral distance D6 from conductive traces 168b and 168c to reduce occurrences of bridging defects or short circuit conditions.

Figure 7C:
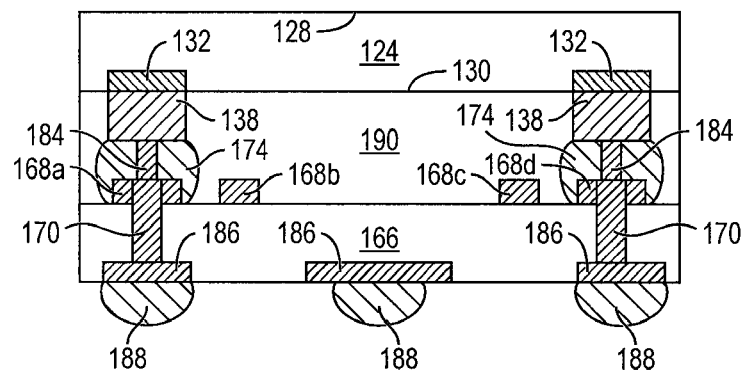

In FIG. 7c, an underfill material 190 is deposited between semiconductor die 124 and substrate 166 to uniformly fill the gap between the semiconductor die and substrate, see FIGS. 10a-10c. Underfill material 190 can include epoxy, epoxy-resin adhesive material, polymeric materials, films, or other non-conductive materials. Underfill material 190 is non-conductive and environmentally protects the semiconductor device from external elements and contaminants.

An electrically conductive bump material is deposited over conductive layer 186 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 186 using a suitable attachment or bonding process. In one embodiment, the bump material is reflowed by heating the material above its melting point to form spherical balls or bumps 188. In some applications, bumps 188 are reflowed a second time to improve electrical contact to conductive layer 186. In one embodiment, bumps 188 are formed over a UBM having a wetting layer, barrier layer, and adhesive layer. Bumps 188 can also be compression bonded to conductive layer 186. Bumps 188 represent one type of interconnect structure that can be formed over conductive layer 186. The interconnect structure can also use bond wires, conductive paste, stud bump, micro bump, or other electrical interconnect.

Figure 8A:
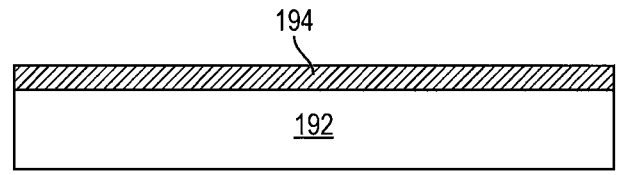
FIGS. 8a-8j illustrate a process of forming conductive protrusions over conductive vias as fixed offset vertical interconnect structures of a semiconductor die.

FIGS. 8a-8j illustrate, in relation to FIGS. 2 and 3a-3c, a process of forming conductive protrusions over conductive vias as fixed offset vertical interconnect structures of a semiconductor die. In FIG. 8a, PCB or substrate 192 provides structural support and electrical interconnect of semiconductor die. Substrate 192 can be silicon, polymer, beryllium oxide, woven glass and epoxy, or other suitable material.

An electrically conductive layer or RDL 194 is formed over substrate 192 using a patterning and metal deposition process such as printing, PVD, CVD, sputtering, electrolytic plating, and electroless plating. Conductive layer 194 can be one or more layers of Al, Cu, Sn, Ni, Au, Ag, or other suitable electrically conductive material. Conductive layer 194 can be formed over substrate 192 by bonding a dry film or foil to substrate 192. In embodiments that utilize a Cu film as the conductive layer 194, a combination of substrate 192 and Cu conductive layer 194 can be referred to as a CCL.

Figure 8B:
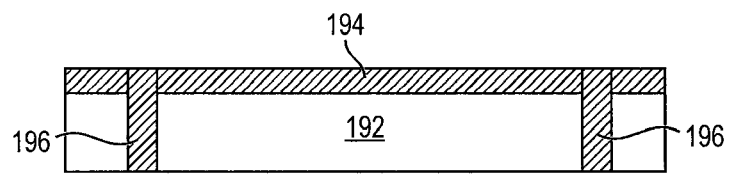

In FIG. 8b, one or more conductive vias 196 are formed through conductive layer 194 and substrate 192. To form conductive vias 196, a plurality of vias is formed through conductive layer 194 and substrate 192 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable metal deposition process to form conductive vias 196.

Figure 8C:
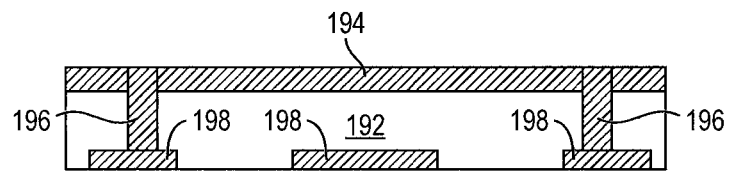

In FIG. 8c, an electrically conductive layer or RDL 198 is formed over a surface or within layers of substrate 192 and conductive vias 196 using a patterning and metal deposition process such as printing, sputtering, electrolytic plating, and electroless plating. Conductive layer 198 can be one or more layers of Al, Cu, Sn, Ni, Au, Ag, or other suitable electrically conductive material. Conductive layer 198 is electrically connected to conductive vias 196.

Figure 8D:
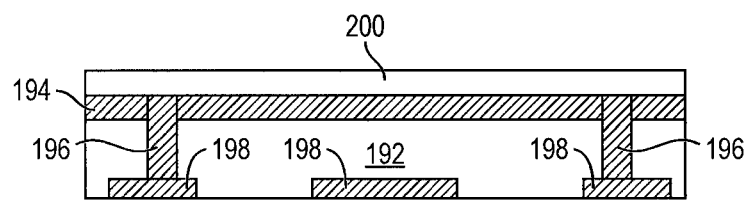

In FIG. 8d, a patterning or photoresist layer 200 is formed over conductive layer 194 and conductive vias 196 using printing, spin coating, or spray coating. Photoresist layer 200 can be a dry film photoresist layer that is applied to conductive layer 194 by a dry film lamination process. In embodiments that utilize an insulating layer for patterning, the insulating layer can include one or more layers of SiO2, Si3N4, SiON, Ta2O5, Al2O3, or other material having similar insulating and structural properties.

Figure 8E:
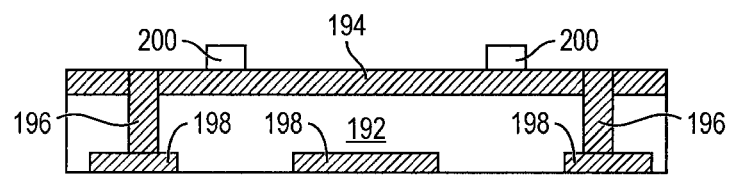

In FIG. 8e, a portion of photoresist layer 200 is exposed and removed by an etching process. An unexposed portion of photoresist layer 200 remains on conductive layer 194 as shown. The remaining portion of photoresist layer 200 forms a mask that is used in a subsequent etching process of conductive layer 194.

Figure 8F:
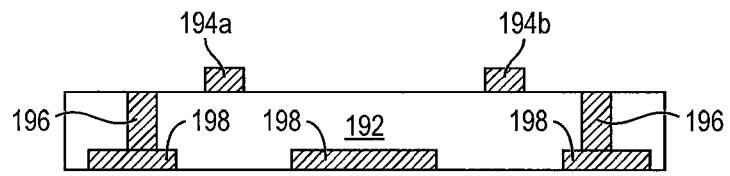

In FIG. 8f, a portion of conductive layer 194 is removed by an etching process to form conductive traces 194a and 194b.

Figure 8G:
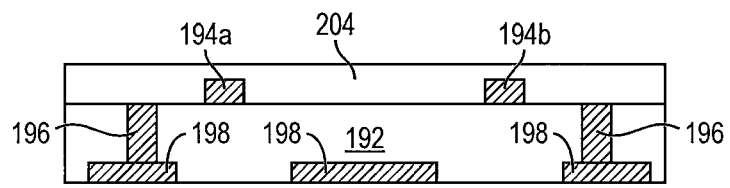

In FIG. 8g, a patterning or photoresist layer 204 is formed over substrate 192 and conductive traces 194a and 194b using printing, spin coating, or spray coating. Photoresist layer 204 can be a dry film photoresist layer that is applied to substrate 192 by a dry film lamination process. In embodiments that utilize an insulating layer for patterning, the insulating layer can include one or more layers of SiO2, Si3N4, SiON, Ta2O5, Al2O3, or other material having similar insulating and structural properties.

Figure 8H:
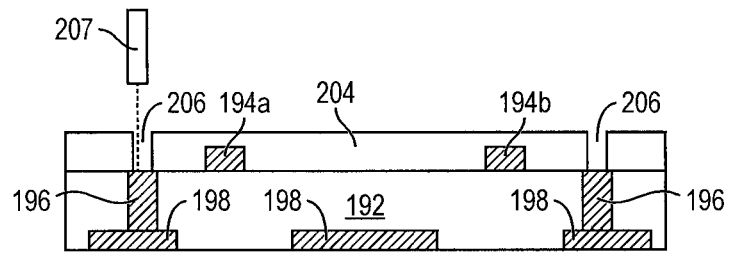

In FIG. 8h, a portion of photoresist layer 204 is exposed and removed by an etching process to form vias 206 in photoresist layer 204. Alternatively, vias 206 are formed by LDA using laser 207. Vias 206 expose an upper surface of conductive vias 196. A width of vias 206 is greater than or less than a width of conductive traces 194a and 194b.

Figure 8I:
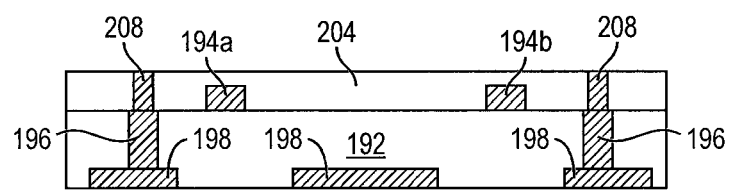

In FIG. 8i, an electrically conductive material is deposited in vias 206 using a deposition process such as electrolytic plating and electroless plating to form conductive protrusions 208. Conductive protrusions 208 can be one or more layers of Al, Cu, Sn, Ni, Au, Ag, Ti, W, or other suitable electrically conductive material. An optional backgrinding process can be performed to planarize upper surfaces of conductive protrusions 208 and photoresist layer 204.

Figure 8J:
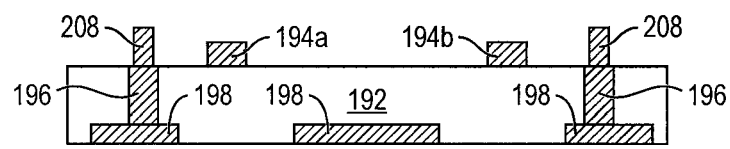

In FIG. 8j, the remaining portions of photoresist layers 204 are removed by a chemical stripping process leaving conductive protrusions 208 over conductive vias 196. In one embodiment, a height of conductive protrusions 208 is 5-20 µm.

Figure 9A:
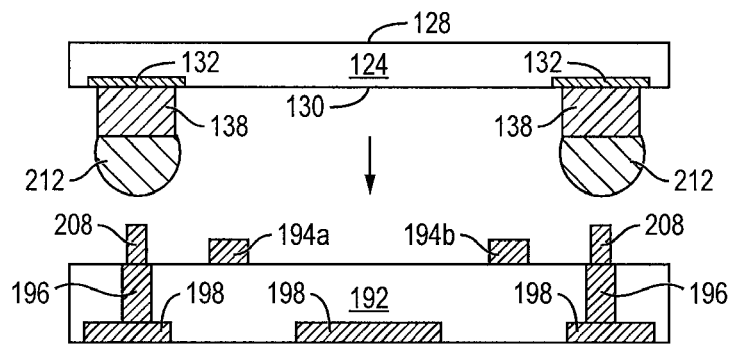
FIGS. 9a-9c illustrate the semiconductor die with conductive protrusions formed over conductive vias as fixed offset vertical interconnect structures.

Continuing from FIG. 4e, semiconductor die 124 has conductive pillars 138 formed over conductive layer 132, as shown in FIG. 9a. Bumps 212 are formed over conductive pillars 138. Semiconductor die 124 is positioned over substrate 192 with active surface 130 oriented towards the substrate and bumps 212 aligned with conductive protrusions 208. Semiconductor die 124 is brought together with substrate 166 such that bumps 212 contact corresponding conductive protrusions 208 and conductive vias 196.

Figure 9B:
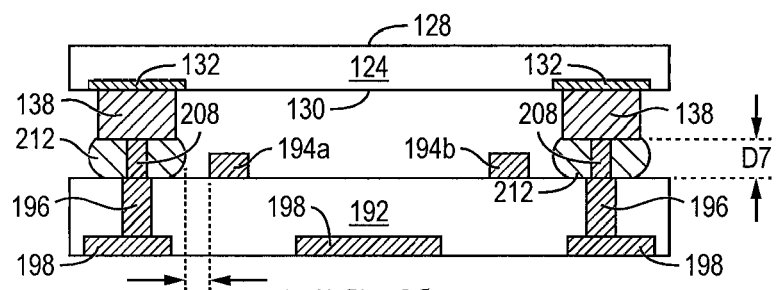
Figure 9C:
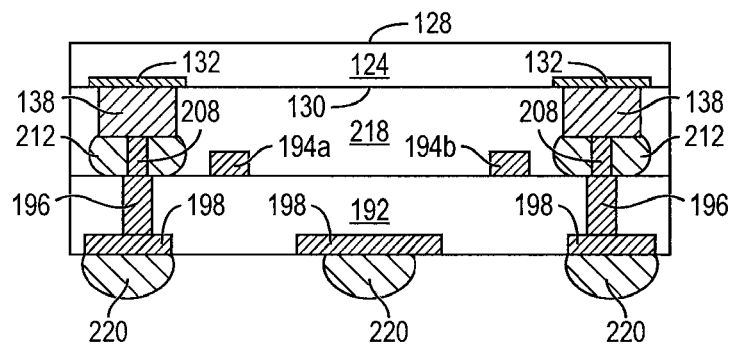

In FIG. 9b, semiconductor die 124 is metallurgically and electrically connected to substrate 192 by reflowing bumps 212 to create an electrical and mechanical interconnection with conductive protrusions 208 and conductive vias 196. In particular, the reflow temperature is greater than the melting point of bumps 212 and less than the melting temperature of conductive pillars 138 and conductive protrusions 208. In a flipchip arrangement, semiconductor die 124 provides a short electrical conduction path from active devices on active surface 130 to conductive protrusions 208 and conductive traces 194a and 194b on substrate 192 in order to reduce signal propagation, lower capacitance, and achieve overall better circuit performance.

Conductive pillars 138 and conductive protrusions 208 remain solid during the reflow of bumps 212 because the reflow temperature is less than the melting point of conductive pillars 138 and conductive protrusions 208. Having the reflow temperature less than the melting point of conductive pillars 138 and conductive protrusions 208 ensures that the conductive pillars and conductive protrusions remain solid during reflow of bumps 212. Conductive protrusions 208 therefore maintain conductive pillars 138 at a minimum distance D7 from conductive traces 194a and 194b during reflow of bumps 174. The height of conductive pillars 138 and conductive protrusions 208 maintains a fixed offset between semiconductor die 124 and substrate 192.

By maintaining the minimum distance D7 between conductive pillars 138 and conductive traces 194a and 194b with the fixed offset, a sufficient underfill gap is maintained between a lower surface of semiconductor die 124 and an upper surface of substrate 192. The underfill gap is the sum of the height of conductive pillar 138 and height of conductive protrusion 208. The fixed offset of conductive pillars 138 and conductive protrusions 208 reduces pressure that would otherwise cause outward movement of bump material in a lateral direction toward adjacent conductive traces 194a and 194b during reflow. Bumps 212 also tend to coalesce around the solid conductive protrusions 208 while in the molten state. Accordingly, bumps 212 remain a minimum lateral distance D8 from conductive traces 194a and 194b to reduce occurrences of bridging defects or short circuit conditions.

In 9c, an underfill material 218 is deposited between semiconductor die 124 and substrate 192 to fill the gap between the semiconductor die and substrate, see FIGS. 10a-10c. Underfill material 218 can include epoxy, epoxy-resin adhesive material, polymeric materials, films, or other non-conductive materials. Underfill material 218 is non-conductive and environmentally protects the semiconductor device from external elements and contaminants.

An electrically conductive bump material is deposited over conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 220. In some applications, bumps 220 are reflowed a second time to improve electrical contact to conductive layer 198. In one embodiment, bumps 220 are formed over a UBM having a wetting layer, barrier layer, and adhesive layer. Bumps 220 can also be compression bonded to conductive layer 198. Bumps 220 represent one type of interconnect structure that can be formed over conductive layer 198. The interconnect structure can also use bond wires, conductive paste, stud bump, micro bump, or other electrical interconnect.

FIGS. 10a-10c illustrate a mold underfill process for encapsulating flipchip packages having vertical interconnects as shown in FIGS. 5a-5c, 7a-7c, and 9a-9c. In FIG. 10a, semiconductor die 124 and substrate 192 from FIG. 9b are placed in chase mold 222. Chase mold 222 has an upper mold support 224 and lower mold support 226 which are brought together to enclose semiconductor die 124 and substrate 192 with open space 228. Upper mold support 224 further includes one or more openings or gates 230 for injecting MUF material into open space 228.

In FIG. 10b, MUF material 236 in a liquid state is injected through gate 230 with nozzle 232 while an optional vacuum assist 234 draws pressure from the side of upper mold support 224 and lower mold support 226 to uniformly fill open space 228 around semiconductor die 124 and substrate 192 with MUF material 236. MUF material 236 can be an encapsulant, molding compound, or polymer composite material, such as epoxy resin with filler, epoxy acrylate with filler, or polymer with proper filler. FIG. 10c shows MUF material 236 disposed around and between semiconductor die 124 and substrate 192.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a plurality of conductive pillars over the semiconductor die;
   forming a plurality of conductive protrusions over the conductive pillars by,
      (a) forming a first patterning layer over the semiconductor die,
      (b) forming a plurality of first vias in the first patterning layer,
      (c) depositing conductive material in the first vias, and
      (d) removing the first patterning layer, wherein a height of the conductive pillars is greater than or equal to a height of the conductive protrusions;
   forming a plurality of bumps over the conductive protrusions and conductive pillars;
   providing a substrate;
   disposing the semiconductor die over the substrate; and
   reflowing the bumps at a temperature that is less than a melting point of the conductive pillars and conductive protrusions with the conductive pillars and conductive protrusions maintaining a fixed offset between the semiconductor die and substrate.

2. The method of claim 1, further including forming the conductive protrusions over a centerline of the conductive pillars.

3. The method of claim 1, wherein forming the plurality of conductive pillars includes:
   forming a second patterning layer over the semiconductor die;
   forming a plurality of second vias in the second patterning layer;
   depositing conductive material in the second vias; and
   removing the second patterning layer.

4. The method of claim 1, further including depositing a mold underfill material between the semiconductor die and substrate.

5. A method of making a semiconductor device, comprising:
   providing a first substrate;
   forming a first patterning layer over the first substrate;
   forming a first via in the first patterning layer;
   depositing conductive material in the first via to form a conductive pillar;
   forming a conductive protrusion extending from a surface of the conductive pillar by,
      (a) forming a second patterning layer over the conductive pillar,
      (b) forming a second via in the second patterning layer,
      (c) depositing conductive material in the second via, and
      (d) removing the second patterning layer;
   removing the first patterning layer; and
   forming a bump over the conductive protrusion.

6. The method of claim 5, further including:
   disposing the first substrate over a second substrate; and
   reflowing the bump at a temperature that is less than a melting point of the conductive protrusion while maintaining a fixed offset between the first substrate and second substrate.

7. The method of claim 6, wherein the fixed offset between the first substrate and second substrate is determined by a height of the conductive pillar and a height of the conductive protrusion.

8. The method of claim 6, further including depositing a mold underfill material between the first substrate and second substrate.

9. The method of claim 5, wherein a height of the conductive pillar is greater than or equal to a height of the conductive protrusion.

10. The method of claim 5, wherein the first substrate includes a semiconductor die.

11. A method of making a semiconductor device, comprising:
   providing a semiconductor die;
   forming a conductive pillar over the semiconductor die;
   forming a conductive protrusion extending from a surface of the conductive pillar, wherein a width of the conductive protrusion at the surface of the conductive pillar is less than a width of the conductive pillar;
   forming a bump over the conductive protrusion and conductive pillar;
   disposing the semiconductor die, conductive protrusion, and bump over a substrate; and
   reflowing the bump at a temperature that is less than a melting point of the conductive protrusion while the conductive protrusion maintains a fixed offset extending from the surface of the conductive pillar to a surface of the substrate.

12. The method of claim 11, further including forming a conductive via through the substrate.

13. The method of claim 11, wherein a height of the conductive pillar is greater than or equal to a height of the conductive protrusion.

14. The method of claim 11, wherein forming the conductive protrusion includes:
   forming a patterning layer over the conductive pillar;
   forming a via in the patterning layer;
   depositing conductive material in the via; and
   removing the patterning layer.

15. The method of claim 11, further including depositing a mold underfill material between the semiconductor and substrate.

* * * * *